(12) United States Patent
Jeong et al.

(10) Patent No.: US 6,279,070 B1
(45) Date of Patent: Aug. 21, 2001

(54) MULTISTEP PULSE GENERATION CIRCUIT AND METHOD OF ERASING A FLASH MEMORY CELL USING THE SAME

(75) Inventors: Jae Heon Jeong; Jong Seuk Lee, both of Kyungki-do (KR)

(73) Assignee: Hyundai Electronics Industries Co., Ltd., Kyungki-do (KR)

( * ) Notice: Subject to any disclaimer, the term of this patent is extended or adjusted under 35 U.S.C. 154(b) by 0 days.

(21) Appl. No.: 09/330,131

(22) Filed: Jun. 11, 1999

(30) Foreign Application Priority Data

Jun. 11, 1998 (KR) ................................................ 98-21701

(51) Int. Cl.⁷ ........................... G06F 12/00; G11C 16/04; G11C 7/00
(52) U.S. Cl. ................... 711/103; 365/218; 365/185.29; 365/238.5
(58) Field of Search ............................ 711/103; 365/218, 365/185.29, 238.5

(56) References Cited

U.S. PATENT DOCUMENTS

| 5,724,303 | 3/1998 | Gannage et al. | 365/238.5 |
| 5,805,501 | 9/1998 | Shiau et al. | 365/185.29 |
| 5,835,414 | 10/1998 | Hung et al. | 365/185.25 |
| 5,862,099 | 1/1999 | Gannage et al. | 365/238.5 |
| 5,890,193 | * 3/1999 | Chevallier | 711/103 |

FOREIGN PATENT DOCUMENTS

| 4-206094 | 7/1992 | (JP) . |
| 4-279298 | 10/1992 | (JP) . |
| 5-028775 | 2/1993 | (JP) . |
| 5-159586 | 6/1993 | (JP) . |
| 6-150675 | 5/1994 | (JP) . |
| 6-187791 | 7/1994 | (JP) . |
| 6-244386 | 9/1994 | (JP) . |
| 6-332797 | 12/1994 | (JP) . |
| 8-180694 | 7/1996 | (JP) . |

* cited by examiner

Primary Examiner—Tuan V. Thai
Assistant Examiner—Brian R. Peugh
(74) Attorney, Agent, or Firm—Pennie & Edmonds LLP

(57) ABSTRACT

There is disclosed a multi-step pulse generating circuit and a method of erasing a flash memory cell using the same, which can shorten the erase time for the flash memory and reduce the size of a device, in a way that it stores the information at the time when the suspense command is input during the multi-step pulse erase operation, switches it into a read mode, and resumes the erase operation from the time when the information is stored.

12 Claims, 6 Drawing Sheets

MULTISTEP PULSE GENERATION CIRCUIT AND METHOD OF ERASING A FLASH MEMORY CELL USING THE SAME

BACKGROUND OF THE INVENTION

1. Field of the Invention

The invention relates generally to a multi-step pulse generating circuit and a method of erasing a flash memory using the same which can reduce the erasing time for the flash memory.

2. Description of the Prior Art

Generally, the procedure of erasing the flash memory cell includes a pre-program step, an erase step and a post-program step. Recently, a multi-step pulse erase method is used to improve the threshold voltage level of the erased memory cell.

However, though the multi-step pulse erase method can improve the threshold voltage level of the memory cell, it has a disadvantage that requires a lot of time since it has to perform pumping in multi-steps. Actually, the pumping, in erasing one sector using the multi-step pulses, requires the time of about 200 ms. Thus, it has a disadvantage that the time of 1400 ms is consumed only for the pumping because there are seven sectors for the memory chip of 200 Mb.

In addition, in case that the suspense command is input during the erasure operation, the erase operation new being performed is suspended and a read mode is then performed. Then, the erase operation is resumed by means of the resume command. However, it has a disadvantage that information on the previous pumping number cannot be found since the block for counting the pumping number of the multi-step pulses in reset upon transformation into the read mode. In other words, when the erase operation is resumed, it requires the time of about 200 ms for the multi-step words, when the erase operation is resumed, it requires the time of about 200 ms for the multi-step pulse erase in one sector since the multi-step erase operation has to be performed from the start. Also, when resuming the erase operation, if the multi-step pulse erase procedure is emitted, the multi-step pulse erase is meaningless.

SUMMARY OF THE INVENTION

It is therefore an object of the present invention to provide a multi-step pulse generating circuit and a method of erasing a flash memory using the same, which can shorten the erase time for the flash memory and reduce the size of a device, in a way that it stores the information at the time when the suspense command is input during the multi-step pulse erase operation, switches it into a read mode, and resumes the erase operation from the time when the information is stored.

In order to accomplish the above object, the multi-step pulse generating circuit is characterized by comprising loop counter for counting the number of repeating eras or program operation based or a loop reset signal output a loop reset circuit when a fail cell is occurred during said erase or program operation, and then generating a multi-step pulse erase mode signal in response to the number of counting; timer for generating pulse signals of appropriate intervals for respective erase modes in response to said multi-step erase mode signal generated from said loop counter; multi-step pulse generating block for outputting a multi-step erase signal, and either a multi-step pulse erase signal or a normal erase signal, based on said multi-step pulse erase mode signal output from said loop counter, said pulse signal output from said timer, an erase mode signal, and an erase reset signal; and pulse generating number counter for counting the number of toggling said pulse signal output from said timer, for generating an erase reset signal to reset said multi-step pulse generating block when a given number of counting is reached, and for storing the counting number at the time when a suspense command is input if said suspense command is input during said multi-step pulse erase mode, and for resuming said multi-step erase mode from the time when the suspense command is stored.

The method of erasing a flash memory cell according to the present invention consists of a pre-program, an erase process and a post-program process, the method comprising the steps of checking whether the present mode is a multi-step pulse erase mode or not, and if so, generating the multi-step pulse to perform the multi-step erase operation; during the multi-step pulse erase operation, confirming at first times whether a suspense command has been input or not, if the suspense command was input, suspending the multi-step pulse erase operation and then incrementing the count of a loop count without resetting a pulse generating number counter, and if the suspense command was not input, resetting the pulse generating number counter and then increment the count of the loop counter, as a result of confirming at second times whether the suspense command has been input or not, if the suspense command was input, resetting the count of the loop counter and then confirming whether the suspense command has been input or not at third times; as a result of confirming at second times whether the suspense command has been input or not, if the suspense command was not input, verifying the erase result, then if the erase operation was not successfully performed, proceeding to the step confirming whether it is the multi-step pulse erase mode or not, and if the erase operation was successfully performed, proceeding to the step which resets the loop counter; as a result of confirming at third times whether the suspense command has been input or not, if the suspense command was input, confirming whether a resume command has been input or not, and if the suspense command was not input, performing the post program process; as a result of confirming whether the resume command has been input or not if, the resume command was input, using the preserved count to resume the multi-step pulse erase operation, if the resume command was not input, switching a read mode; and as a result of checking whether it is the multi-step pulse erase mode or not, if is the normal erase mode not the multi-step pulse erase mode, pumping the voltage level by an erase voltage and then performing the normal erase operation.

According to the present invention, in order to solve a problem of requiring a lot of time since the multi-step pulse generating procedure has to be performed from the start, especially when the erase operation is resumed after being suspended by the suspense command during the erase operation, it switches the information at the time when the erase procedure is suspended by the suspense command into a read mode without resetting the information, and then resumes the erase operation based on the information stored at the time when the suspense command is input upon resuming the erase operation.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1A:
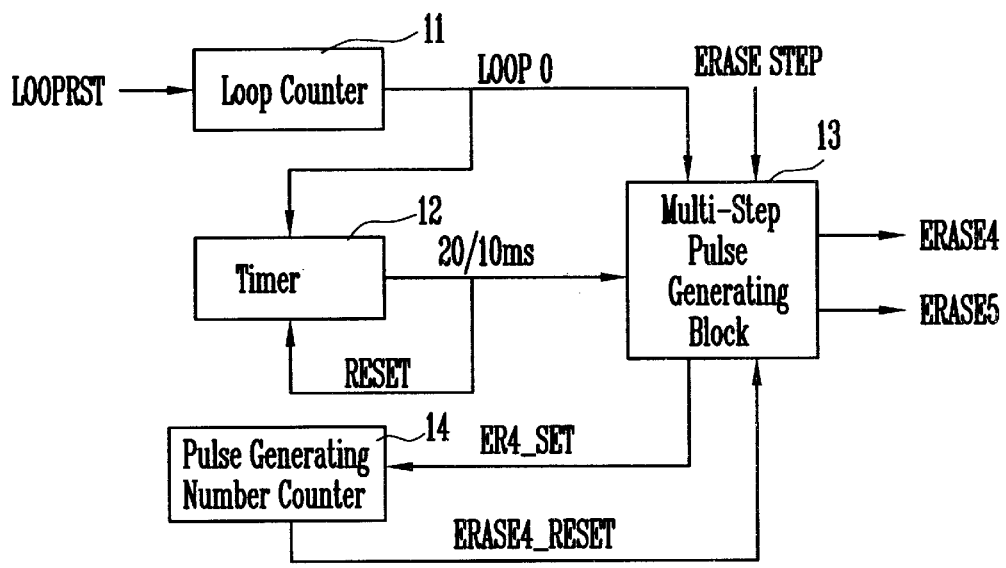
FIGS. 1A and 1B are a block diagram of a multi-step pulse generating circuit according to the present invention, and waveforms for explaining the multi-step pulse generating circuit, respectively.

The present invention will be described in detail by way of a preferred embodiment with reference to accompanying drawings, in which like reference numerals are used to identify the same or similar part.

Figure 1B:
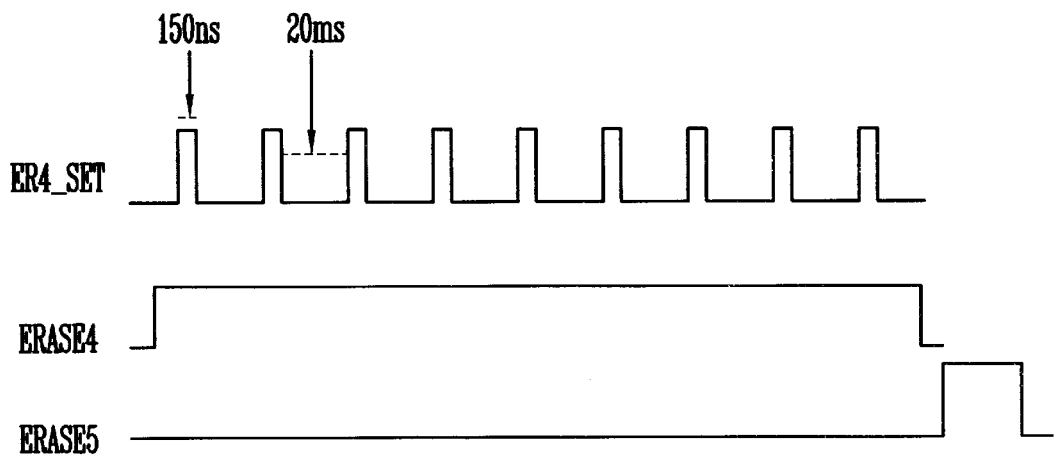

FIGS. 1A and 1B are a block diagram of a multi-step pule generating circuit according to the present invention, and waveforms for explaining the multi-step pulses generating circuit, respectively.

Generally, if fail cells are found when performing erase or program of a flash memory, the erase or program operation is repeated based on a fixed looping number. A loop counter 11 shown in FIG. 1A is a block for counting the number of looping.

A timer 12 outputs a pulse having 10 ms or 20 ms pulse period in response to the output signal LOOP0 from the loop counter 11.

A multi-step pulse (hereinafter called MPS) generating block 13 outputs a multi-step erase signal ER4_SET, based on the output signal LOOP0 from the loop counter 11, an erase mode signal ERASE STEP, and a pulse from the timer 12, and at the same time a multi-step pulse erase signal ERASE4 or a normal erase signal ERASE5 is outputted.

A pulse generating number counter 14 counts the number of which the multi-step erase signal ER4_SET output from the multi-step pulse generating block 13 is toggled until it reaches to a given number (i.e., 9), and when the given number is counted, outputs an erase reset signal ERASE4_ RESET. At this time, the multi-step pulse generating block 13 resets the multi-step pulse erase signal ERASE4 based on the erase reset signal ERASE_RESET and then enables the normal erase signal ERASE5. Also, as the pulse generating number counter 14 is designed not to be reset even when the suspense command is input during the multi-step pulse erase operation, it can perform the erase operation from the time when the information is stored when the erase operation is resumed.

Next, the operation of the multi-step pulse generating circuit having these functional blocks will be explained below.

First, the multi-step pulse erase mode signal LOOP0 is output from the loop corner 11, in which only when the signal is High, the multi-step pulse erase mode operation can be performed. Then, the erase mode signal ERASE STEP is input to the MSP block 13. When the multi-step pulse erase mode signal LOOP0 is High, the multi-step pulse erase signal ERASE4 become High to resume the multi-step erase operation. Also, as the multi-step pulse erase mode signal LOOP0 becomes High, the timer 12 outputs a pulse having 10 ms or 20 ms pulse period in response to the output signal LOOP0 from the loop counter 11.

FIG. 1B shows an example of the pulse having about 150 ns in width. The pulse corresponds to the multi-step pulse signal ER4_SET generated from the multi-step pulse generating block 13. Though not shown in FIG. 1B, a voltage pumping circuit pumps step-by-step the erase voltage every time when the multi-step pulse signal ER4_SET becomes High. Also, the multi-step pulse signal ER4_SET is input as a clock signal to the pulse generating number counter 14, in which every time when the signal is toggled, the number is counted. Then, the pulse generating number counter 14 counts the toggle number of the multi-step pulse signal ER4_RESET and if the result reaches to 10 (i.e., Loop0 becomes High), enables the erase reset signal ERASE_ RESET. Accordingly, the enabled signal resets the multi-step pulse erase signal ERASE4 to become Low, finishes the multi-step pulse erase operation and then resumes the normal erase operation.

The loop reset signal LOOPRST input to the loop counter 11 serves as a signal to prevent the multi-step pulse erase operation from being performed, in a way that when the suspense command is input at the multi-step pulse erase mode (i.e., LOOP0 is High), the suspense command is operated as a clock signal to make the reset signal LOOPRST High, thus resetting the loop counter 11, but when the suspense command is input at the normal erase mode (i.e., LOOP0 is Low), the suspense command does not reset the loop counter block 11.

Figure 2:
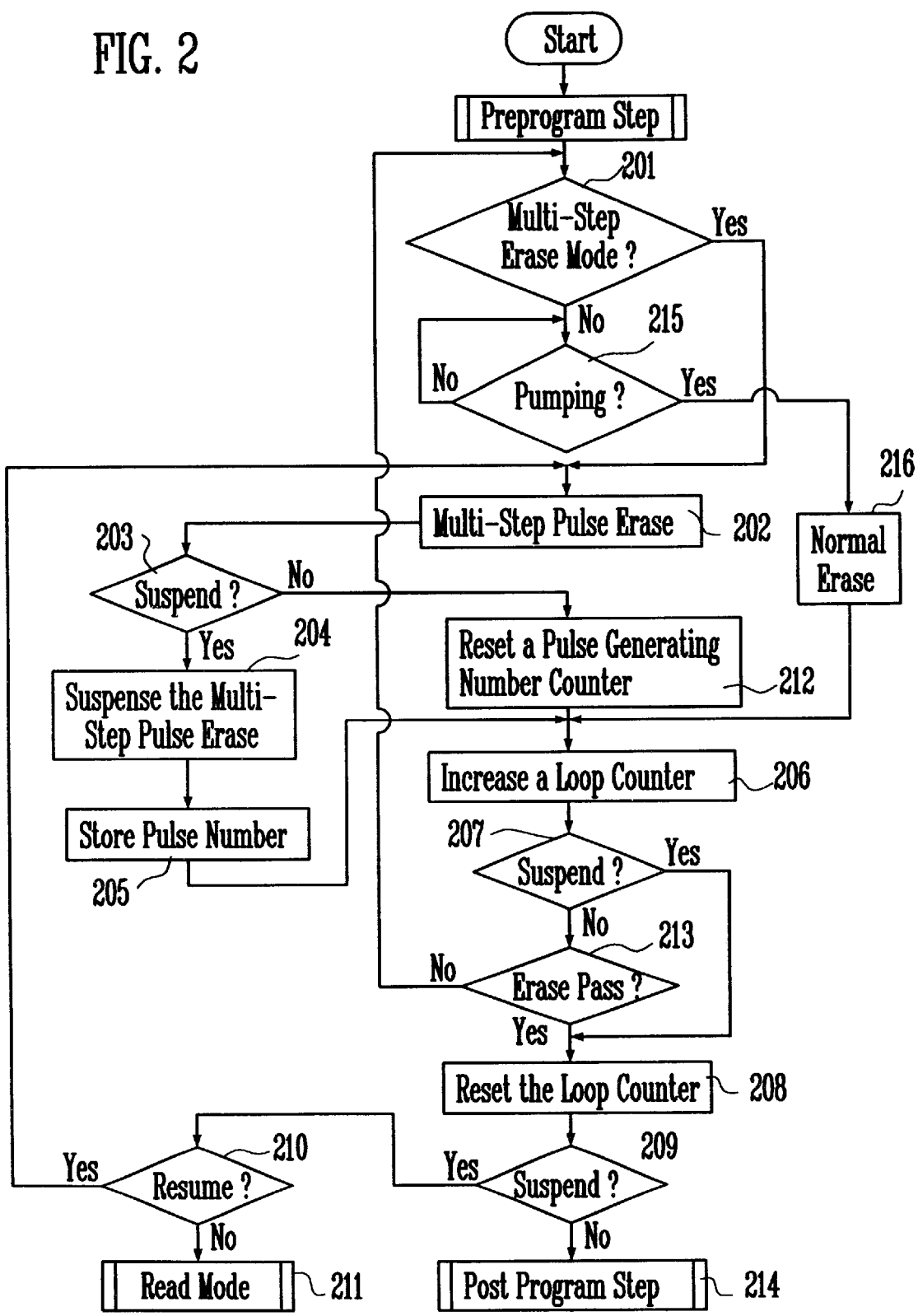
FIG. 2 shows a flow chart for illustrating a method of erasing a flash memory cell according to the present invention.

FIG. 2 shows a flow chart for illustrating a method of erasing a flash memory according to the present invention.

The procedure of erasing the flash memory includes a preprogram step, an erase step and a post program step.

After the preprogram step is performed, when the eras step starts, it checks whether the erase mode being now performed is a multi-step pulse erase mode (201).

As a result of the check, if it is the multi-step pulse erase mode (in case that the LOOP0 signal is High), it generates a multi-step pulse to perform an erase process (202). During the multi-step pulse erase process, it is confirmed whether the suspense command SUS has been input (203). If the suspense command SUS has been input, it suspends the multi-step pulse erase (204), and then proceeds to the step 206 in which the loop count is incremented, at the state in which the count of the counter at the time when the suspense command SUS is input is not reset (205.

In step 206, after the count of the loop counter is incremented, it checks whether the suspense command SUS has been input at second times. If the suspense command SUS has been input, it resets the count of the loop counter (208) and checks whether the suspense command SUS has been input (209) at third times.

However, as a result of checking at second times (207), the suspense command SUS has not been input, it confirms that whether the erase operation has been successfully performed (213). As a result of confirming the erase operation, if the erase operation has been successfully performed, it proceeds to step 208 in which the count of the loop counter is reset. However, if the erase operation was not successfully performed, it proceeds to step 201 to conform whether it is the multi-step pulse erase mode.

As a result of confirming at third times whether the suspense command SUS has been input, if the suspense command is input, it proceeds to step 210 in which the multi-step pulse erase mode resume command has been input. At this step, if the resume command has been input, it proceeds to a multi-step pulse erase start mode step 202. However, if the resume command was not input, it transfer to a read mode 211. Also, as a result of confirming at third times whether the suspense command SUS has been input, if the suspense command has not been input, it proceeds to a post program step 214.

At stop 203, as a result of confirming at first times whether the suspense command has been input, if the suspense command has not been input, it resets the count of the pulse generating number counter (212) and then proceeds to step 206 in which the count of the loop counter is incremented.

However, if it is the normal erase mode from the step confirming whether it is the multi-step pulse erase mode (202), it confirms whether to pump a voltage for the normal erase mode up to an appropriate voltage depending on the current erase voltage (215). After the pumping is completed, it performs the normal erase process (216) and then proceeds to step 206 in which the count of the loop counter is incremented.

Figure 3:
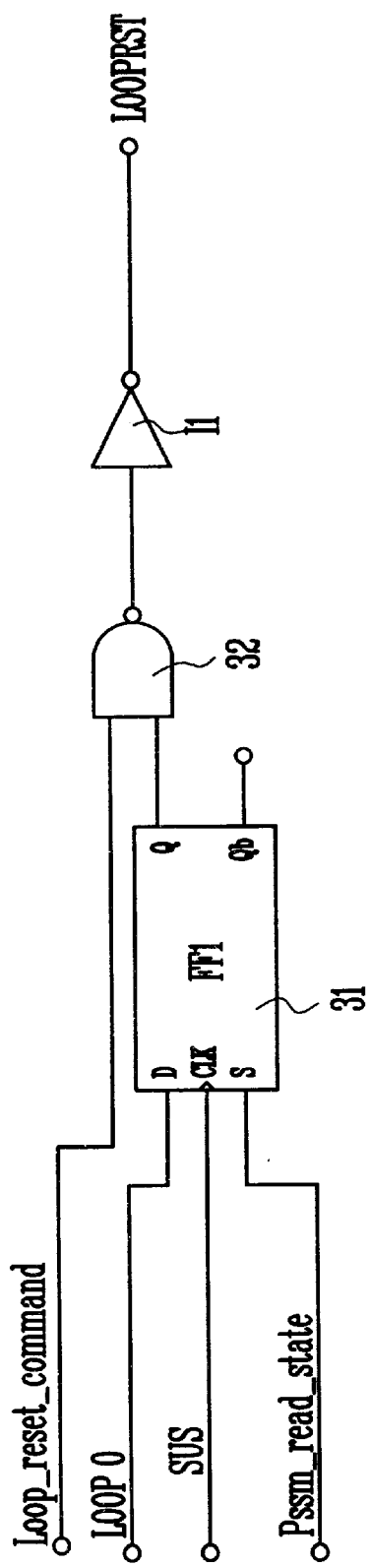
FIG. 3 shows a loop reset signal generating circuit of the multi-step pulse generating circuit according to the present invention.

FIG. 3 shows a loop reset signal generating circuit of the multi-step pulse generating circuit according to the present invention.

The loop reset signal LOOPRST input to the loop counter 11 shown in FIG. 1 is a signal which when the suspense command SUS is input at the multi-step pulse erase mode (i.e., LOOP0 is at High state) it is operating as a clock signal to make the loop reset signal LOOPRST become High, thus resetting the loop counter 11, but when the suspense command SUS is input at the normal erase mode (i.e., LOOP0 is at Low state), it forces the loop count block 11 not to reset, thus preventing the multi-step pulse erase operation.

Turning to FIG. 3, the multi-step pulse erase mode signal LOOP0 is delayed/output by the first flip-flop 31 which uses the suspense command SUS as a clock signal and the ready signal Pssm__read__state as a set signal S. The output of the first flip-flop 31 is input to the first NAND gate 32 together with the loop reset command signal Loop__reset__command and the output of the first NAND gate 32 is inverted via the first inverter 11, thus obtaining a loop reset signal LOOPRST.

Here, the ready signal Pssm__read__state means a signal which is initiated to perform a next operation before/after the operation such as erase or program etc.

Figure 4A:
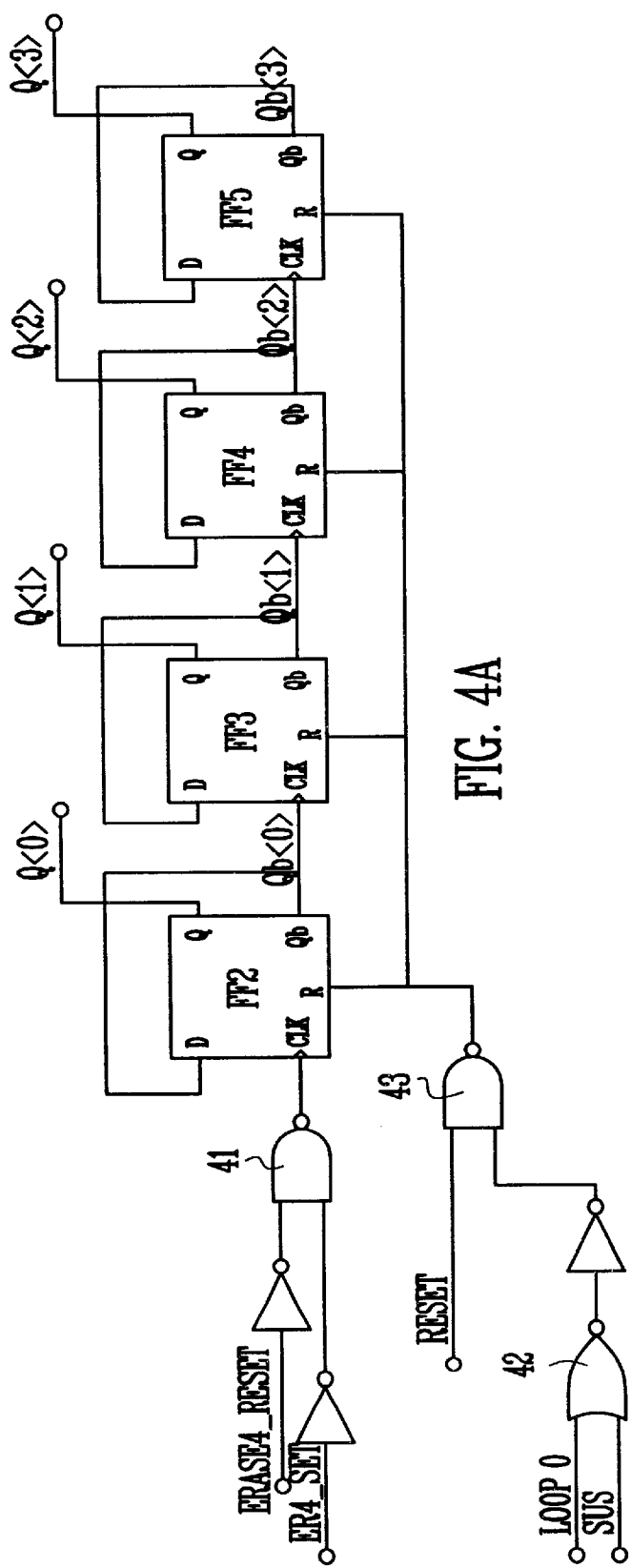
FIGS. 4A and 4B are detailed circuit diagrams of a pulse generating number counter of the multi-step pulse generating circuit according to the present invention.
Figure 4B:
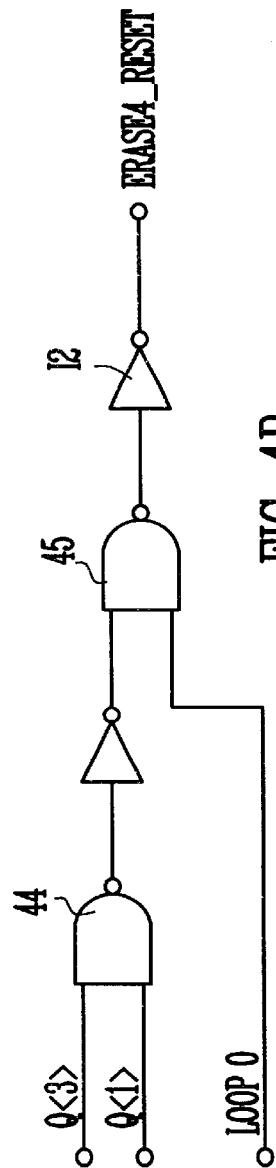

FIGS. 4A and 4B are detailed circuit diagrams of a pulse generating number counter of the multi-step pulse generating circuit according to the present invention.

As explained in FIG. 1, the pulse generating number counter (14 in FIG. 1) counts the number of toggling the multi-step pulse signal ER4__SET output from the multi-step pulse generating block (13 in FIG. 1). When a given counting number is reached, the pulse generating number counter 14 becomes the erase reset signal ERASE4__RESET High to suspend the counting and at the same time, makes the multi-step pulse erase signal ERASE4 become Low to finish the multi-step pulse erase process.

Turning to FIG. 4A, when the multi-step pulse erase signal (LOOP is High) starts, the erase reset signal ERASE4__RESET is at Low state and the multi-step pulse signal ER4__SET input from the multi-step pulse generating block (13 in FIG. 1) has waveforms as shown in FIG. 1B. The erase reset signal ERASE4__RESET and the multi-step pulse signal ER4__SET are respectively inverted and then input to the second NAND gate 41, the output value of which becomes a clock signal of the second flip-flop FF2.

The second through fifth flip-flops FF2 to FF5 which are serially connected are delay flip-flops, and a logical combination of the multi-step pulse erase mode signal LOOP0 and the suspense signal SUS is used as each reset signal of respective flip-flops FF2 to FF5. In other words, the multi-step pulse erase mode signal LOOP0 and the suspense signal SUS is input to the first NOR gate 42, and the output signal of the first NOR gate 42 is inverted and then input to the third NAND gate 43 together with the reset signal RESET. When the multi-step pulse erase mode LOOP0 is at High state, the output value of the first NOR gate 42 is always at Low state regardless of the suspense command SUS. At an initial state, as the reset signal RESET is at High state, the output of the third NAND gate 43 becomes Low to reset the second through fifth flip-flops FF2 to FF5. Thus, as the first NOR gate 42 is not affected by the suspense command SUS, even though it is switched to a read mode by the suspense command during the multi-step pulse erase operation and is again returned to the multi-step pulse erase mode, the pulse generating number count block is not reset.

If the multi-step pulse signal ER4__SET which had been at Low state is toggled to a High state, the erase reset signal ERASE4__RESET and the multi-step pulse signal ER4__SET an respectively inverted and input to the second NAND gate 41. As a result, the output of the second NAND gate 41 becomes High. As the erase reset signal ERASE4__RESET will be maintained at Low state at the multi-step pulse erase mode (LOOP0 is High), the output values of the second through fifth flip-flops FF2 to FF5 will be varied every time when the multi-step pulse signal ER4__SET having the waveforms shown in FIG. 1B toggles from High to Low. That is, the toggle number of the multi-step pulse signal FR4__SET is counted.

FIG. 4B shows a circuit diagram for counting the toggle number of the multi-step pulse signal ER4__SET up to a given number and for finishing the multi-step pulse erase process.

During a general multi-step pulse erase operation, as the multi-step pulse signal ER4__SET toggles from a Low state to a High state at nine times, when the output signals (Q<3>Q<2<Q <1>Q<0>) of the second through fifth flip-flop FF2 to FF5 which are the results of counting the toggling number, become '1010', the toggling is finished and the erase reset signal ERASE4__RESET becomes High.

In other words, when the output signals (Q<3>Q<1>) of the fifth and third flip-flops FF5 and FF3 become first '11' at the same time, the output of the fourth NAND gate 44 becomes a Low level. Then, even though the multi-step pulse erase mode signal lOOP0 is at High state, to the first input terminal of the fifth NAND gate 45 is input the inverted output of the fourth NAND gate 44 with a High level, and also to the second input terminal of the fifth NAND gate 45 is input the multi-step pulse erase mode signal LOOP0. When the first input signal is at High state, as the fifth NAND gate 45 always has Low regardless of the second input signal LOOP0, the erase reset signal ERASE4__RESET becomes a High state. Thus, as the erase reset signal ERASE4__RESET becomes a High state, the multi-step pulse erase mode is finished and the normal erase mode is initiated.

FIGS. 5A through 5J are circuit diagrams for illustrating a method of determining a voltage level at each step upon generation of the multi-step pulse according to the present invention.

During the multi-step pulse erase operation, when the suspense command is input, as it is switched to a read mode without resetting the pulse generating number count block which is now counting the toggling number in the present invention, it has to generate a voltage level suitable for the step in which the resume is started when it is returned to the multi-step pulse erase operation.

The multi-step pulse generated upon erasing of the multi-step pulse includes ten levels. According, the pump driving signals ISP1 through ISP0 for generating the voltages suitable for respective steps are obtained from the post-program signal PSTPGM, the normal erase signal ERASE5, the program signal PGM, the program verification signal PVER, and the output signals (Q<0> through Q<3>) made from the pulse generating number counter of the pulse generating number count block.

Generally, the voltage levels of each of the steps are incremented by 0.5V every time when the multi-step pulse signal ER4_SET is once toggled.

Figure 5A:
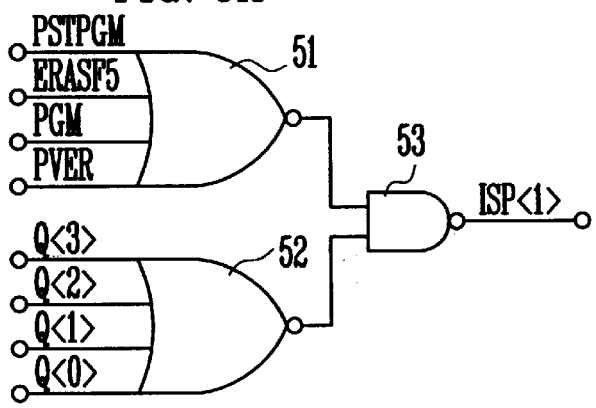
FIGS. 5A through 5J are circuit diagrams for illustrating a method of determining a voltage level at each step upon generation of the multi-step pulse according to the present invention.

As shown in FIG. 5A, the signal ISP1 for generating the first voltage level is obtained by performing a logical operation using the post-program signal PSTPGM, the normal erase signal ERASE5, the program signal PGM and the program verification signal PVER as an input to a second NOR gate 51, and also using the first through fourth output signal (Q<0<, Q<1<, Q<2>,Q<3>) as an input to the third NOR gate 52. Then, it is obtained by logically operating the output of the second and third NOR gates 51 and 52 via the sixth NAND gate 53.

Figure 5B:
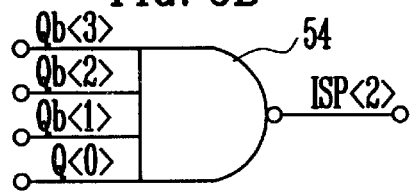

As shown in FIG. 5B, the signal ISP2 for generating the second voltage level is obtained from the output value of the seventh NAND gate 54 using the first through fourth output signals (Q<0>, Qb<1>,Qb<2>,Qb<3>) of the pulse generating number counter in the pulse generating number counter block as an input.

Figure 5C:
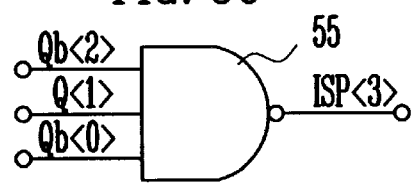

As shown in FIG. 5C, the signal ISP3 for generating the third voltage level is obtained from the output value of the eighth NAND gate 55 using the first through third output signals (Qb<0>,Q<1>,Qb<2>) of the pulse generating number counter in the pulse generating number counter block is an input.

Figure 5D:
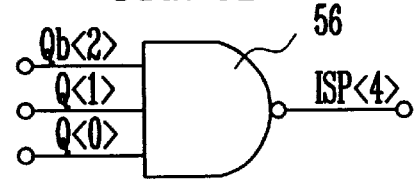

As shown in FIG. 5D, the signal IS4 for generating the fourth voltage level is obtained from the output value of the ninth NAND gate 56 using the first through third output signals (Q<0>,Q<1>, Qb<2>) of the pulse generating number counter in the pulse generating number counter block as an input.

Figure 5E:
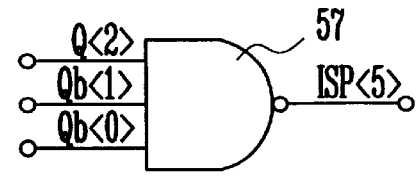

As shown in FIG. 5E, the signal ISP5 for generating the fifth voltage level is obtained from the output value of the tenth NAND gate 57 using the first through third output signals (Qb<0>,Qb<1>, Q<2>) of the pulse generating number counter in the pulse generating number counter block as an input.

Figure 5F:
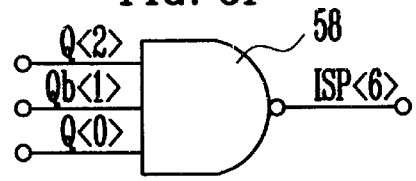

As shown in FIG. 5F, the signal ISP6 for generating the sixth voltage level is obtained from the output value of the eleventh NAND gate 58 using the first through third output signal (Q<0>, Qb<1>, Q<2>) of the pulse generating number counter in the pulse generating number counter block as an input.

Figure 5G:
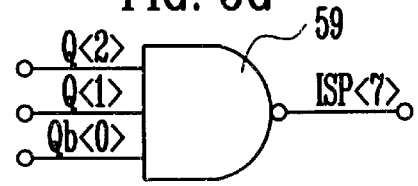

As shown in FIG. 5G, the signal ISP7 for generating the seventh voltage level is obtained from the output value of the twelveth NAND gate 59 using the first through third output signals (Qb<0>, Q<1>, Q<2>) of the pulse generating number counter in the pulse generating number counter block as an input.

Figure 5H:
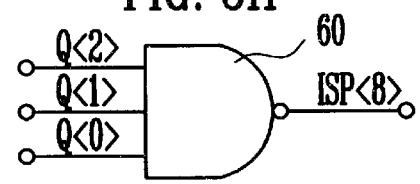

As shown in FIG. 5H, the signal ISP8 for generating the eight voltage level is obtained from the output value of the thirteenth NAND gate 60 using the first through third output signals (Q<0>, Q<1>,Q<2>) of the pulse generating number counter in the pulse generating number counter block as an input.

Figure 5I:
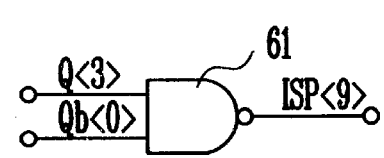

As shown in FIG. 5I, the signal ISP9 for generating the ninth voltage level is obtained from the output value of the fourteenth NAND gate 61 using the first and fourth output signals (Qb<0>, Q<3>) of the pulse generating number counter in the pulse generating number counter block as an input.

Figure 5J:
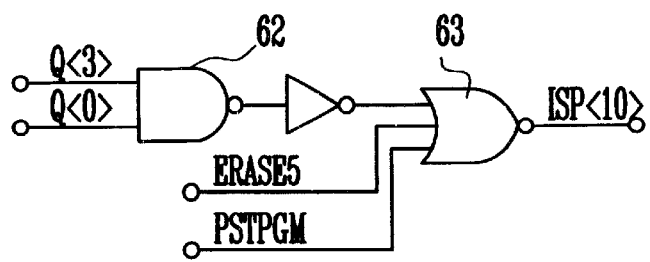

As shown in FIG. 5J, the signal ISP10 for generating the tenth voltage level is obtained from the inverted signal of the output value of the fifteenth NAND gate 62 using the first and fourth output signals (Q<0>,Q<3>) of the pulse generating number counter in the pulse generating number counter block as an input, and the output value of the fourth NOR gate 63 using the normal erase signal ERASE5 and the post-program signal PSTPGM as an input.

FIGS. 6A through 6E are circuit diagrams for generating signals necessary for the multi-step pulse generating circuit according to the present invention.

Figure 6A:
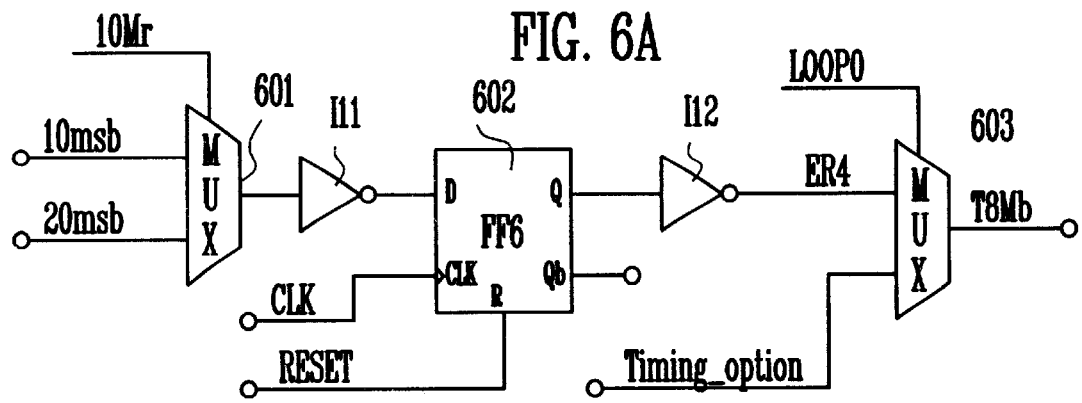
FIGS. 6A through 6E are circuit diagrams for generating signals necessary or the multi-step pulse generating circuit according to the present invention.

First, FIG. 6A shows a timer circuit for generating a pulse having a period of 20 ms or 10 ms using the multi-step pulse erase mode signal LOOP0 being the output signal of the loop counter (11 in FIG. 1) as an input.

For example, if the control signal 10Mr of the first multiplexer 601 is High, an inverted 10 ms pulse signal is output, and if the control signal 10 Mr thereof is Low, an inverted 20 ms pulse signal is output. Then, the signal output via the first multiplexer 601 is inverted by inverter I11 and input to the sixth flip-flop 602 being the delay flip-flop, where the sixth flip-flop 602 outputs a pulse signal ER4b depending on the reset signal RESET supplied externally and the clock, signal CLK. Pulse signal ER4b is then inverted by inverter I12 to become ER4. And, the second multiplexer 603 uses the multi-step pulse erase mode signal LOOP0 as a control signal. If the multi-step pulse erase mode signal LOOP0 is High, it outputs a 10 ms or 20 ms pulse period signal to the output terminal T8Mb to toggle the multi-step pulse signal ER4_SET at 10 ms or 20 ms pulse intervals. On the contrary, if the multi-step pulse erase mode signal LOOP0 is Low, it outputs a single signal among pulse periods, for example 10 ms, 5 ms, 500 μs, 10 μs, suitable for the normal erase mode depending on the timing select signal Timing_option being other signal of the second multiplexer 603 to the output terminal T8Mb.

Figure 6B:
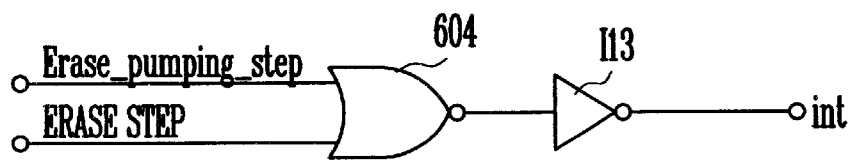

FIG. 6B is an initialization signal (int) generating circuit used to generate the multi-step pulse erase signal ERASE4, the multi-step pulse signal ER4_SER and the normal erase signal ERASE5

During the multi-step pulse erase operation, as the erase mode signal ERASE_STEP is at High state, the initialization signal generating circuit is operated by the erase pumping signal Erase_Pumping_Step. If the erase pumping signal Erase_Pumping_Step is High, the output value of the fifth NOR gate 604 become Low, which is then inverted via inverter I13 to make the initialization signal (int) High.

Figure 6C:
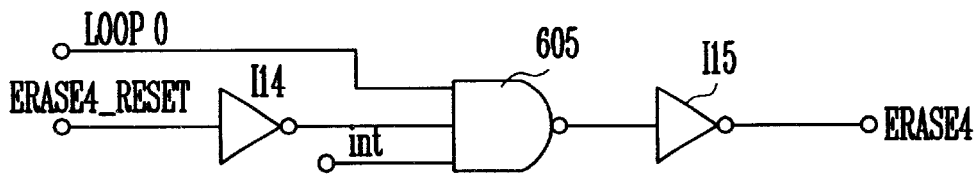

FIG. 6C is the multi-step pulse erase signal (ERASE4) generating circuit.

If the initialization signal (int) is at High state, as the inverted signals of the multi-step pulse erase mode signal LOOp0 and the multi-step erase reset signal ERASE4_ RESET which is inverted by inverter 114, are also at High state upon a multi-step erase mode, the output value of the sixteenth NAND gate 605 becomes Low. Thus, the multi-step pulse erase signal ERASE4 the output value of the sixteenth NAND gate 605 is inverted by inverter 115, becomes High.

Figure 6D:
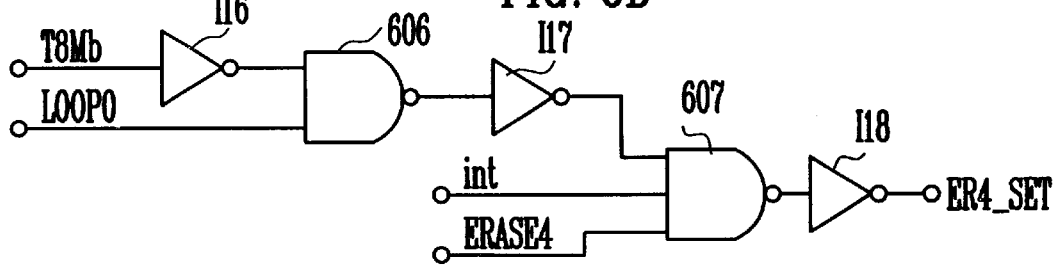
Figure 6E:
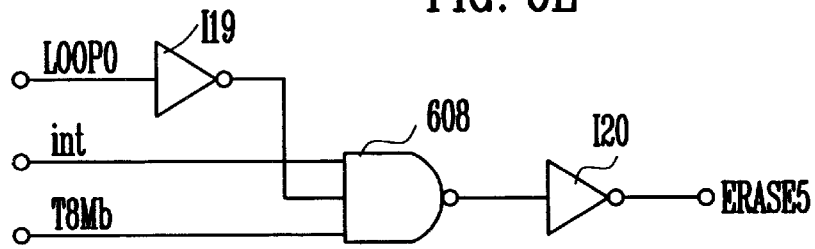

FIG. 6D is the multi-step pulse signal ER4_SET generating circuit.

If the initialization signal (int) is at High state, the multi-step pulse erase mode signal LOOP0 and the multi-step pulse erase signal ERASE4 become a High state during the multi-step erase process. Also, the pulse period count signal of 20 ms intervals output via the timer circuit shown in FIG. 6A is used as an input signal.

First, output signal T8Mb from the timer circuit is inverted by inverter I16 and seventeenth NAND gate 606 outputs the inverted signal of the output signal T8Mb from the timer circuit based on the multi-step pulse erase mode signal LOOP0; the output signal from seventeenth NAND gate 606 is inverted by inverter 117 and the eighteenth NAND gate 607 uses the inverted signal of the output signal from the seventeenth NAND gate 606, the initialization signal (int) and the multi-step pulse erase signal ERASE4 as an input; and the inverted signal of the eighteenth NAND gate 607, after being inverted by inverter 118, becomes the multi-step pulse signal ER4_SET.

If this process is repeated ten times, the multi-step erase reset signal ERASE4_RESET becomes High, and thus the multi-step pulse erase signal ERASE4 becomes Low. Accordingly, the multi-step pulse signal ERASE4 becomes Low, the multi-step pulse signal ER4_SET is no longer generated to finish the multi-step pulse erase process.

FIG. 6I is the normal erase signal (ERASE5) generating circuit.

If the initialization signal (int) is at High state and the multi-step pulse erase mode LOOP0 is at High state, the output signal of the nineteen NAND gate 608 becomes High regardless of the output signal T8Mb of the timer circuit, and thus the normal erase signal ERASE5 becomes a Low state.

On the contrary, if the multi-step pulse erase process is finished with the initialization signal (int) being at High state, and thus the multi-step pulse erase mode signal LOOP0 becomes Low, in response to the timing select signals Timing_option from the timer circuit, the normal erase process is performed using any one of the count signals having the intervals of 10 ms, 5 ms, 500 µs, and 10 µs as a pulse period. That is, the normal erase signal ERASE5 is obtained by inverting, via inverter 119, the output of the nineteenth NAND gate 608 using the inverted value of the multi-step pulse erase mode signal LOOP0, which is inverted by inverter 120 the initialization signal (int) and the output signal T8Mb of the timing circuit as an input.

As mentioned above, according to the present invention it can provide an outstanding effect of shortening the erase time for the flash memory and reducing the size of a device, in a way that it stores the information at the time when the suspense command is input during the multi-step pulse erase operation, switches it into a read mode, and resumes the erase operation from the time when the information is stored.

The present invention has been described with reference to a particular embodiment to connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A multi-step pulse generating circuit, comprising:
   loop counter for counting the number of repeating erase or program operation based on an output of a loop reset circuit and generating a multi-step pulse erase mode signal, the loop counter being reset by a loop reset signal when a suspense command is input during a multi-step pulse erase operation, the loop counter not being reset when the suspense command is input during a normal erase operation;
   timer for generating a pulse signal of appropriate intervals for respective erase modes in response to said multi-step pulse erase mode signal of said loop counter;
   multi-step pulse generating block for outputting a multi-step erase signal, and either a multi-step pulse erase signal or a normal erase signal, based on the multi-step pulse erase mode signal of said loop counter, said pulse signal output from said timer, an erase mode signal, and an erase reset signal; and
   pulse generating number counter for counting the number of toggling said pulse signal output from said timer, for generating an erase reset signal to reset said multi-step pulse generating block when a given number of counting is reached, and for storing the counting number at the time when a suspense command is input if said suspense command is input during said multi-step pulse erase mode, and for resuming said multi-step erase mode from the time when the suspense command is stored, said pulse generating number counter comprising a plurality of logic gates and a plurality of flip-flops.

2. The multi-step pulse generating circuit as claimed in claim 1, wherein said loop reset circuit comprises:
   a first flip-flop using the multi-step pulse erase mode signal as an input, the suspense command as a clock signal, and a ready signal for initializing the net operation before or after the erase or program operation as a set signal;
   a first NAND gate using the output signal of the first flip-flop and a loop reset command signal as inputs; and
   a first inverter for inverting the output of the first NAND gate.

3. The multi-step pulse generating circuit as claimed in claim 1, wherein said pulse generating number counter comprises second through fifth flip-flops using the output of a third NAND gate as a reset signal, said third NAND gate using the signal obtained by logically combining the multi-step pulse erase mode signal and a suspense signal by a first NOR gate, wherein said second flip-flop uses the erase reset signal and a multi-step pulse signal which are inverted and then logically combined by a second NAND gate as a clock signal; and wherein said second through fifth flip-flops are serially connected to each other with the third through fifth flip flops receiving, as a lock signal, an inverted output from the second through fourth flip flops, respectively; and each of second through fifth flops having their own inverted outputs fed back as a flip-flop input.

4. The multi-step pulse generating circuit as claimed in claim 1, wherein said erase reset signal is generated by an erase reset circuit comprising a fourth NAND gate using the output values of the third and fifth flip-flops, a fifth NAND gate using the inverted value of the output value from the fourth NAND gate and the multi-step pulse erase mode signal as inputs, and a second inverter for inverting the output value of the fifth NAND gate.

5. The multi-step pulse generating circuit as claimed in claim 1, wherein said tuner includes a first multiplexer for outputting a pulse signal having a period of 10 ms or 20 ms depending on the control signal, a sixth flip-flop for outputting the inverted value of the output value from the first multiplexer depending on a clock signal and a reset signal, and a second multiplexer for outputting any one of the output of the sixth flip-flop and the timing signal using the multi-step pulse erase mode signal as a control signal.

6. The multi-step pulse generating circuit as claimed in claim 1, wherein said multi-step pulse erase signal is generated by a multi-step pulse erase signal generating circuit comprising a sixth NAND gate using the multi-step pulse erase mode signal, the inverted signal of the erase reset signal, and an initialization signal as inputs, and a third inverter for inverting the output value of the sixth NAND gate to output the inverted result.

7. The multi-step pulse generating circuit as claimed in claim 1, wherein a multi-step pulse signal is generated by a multi-step pulse signal generating circuit comprising a seventh NAND gate using the inverted value of an output signal of the timer and the multi-step pulse erase mode signal as inputs, a eighth NAND gate using the output value of the seventh NAND gate, an initialization signal and the multi-step pulse erase signal as inputs, and a fourth inverter for inverting the output value of the eighth NAND gate to output the inverted result.

8. The multi-step pulse generating circuit as claimed in claim 1, wherein said normal erase signal is generated by a normal erase signal generating circuit comprising a ninth NAND gate using an initialization signal, the multi-step pulse erase mode signal and an output signal of the timer as inputs, and a fifth inverter for inverting the output value of the ninth NAND gate to output the inverted result.

9. The multi-step pulse generating circuit as claimed in claim 6, wherein said initialization signal is generated by an initialization generating circuit including a second NOR gate using an erase pumping signal and the erase mode signal, and a sixth inverter for inverting the output value of the second NOR gate to output the inverted result.

10. A method of erasing a flash memory cell, comprising the steps of:

checking whether a present mode is a multi-step pulse erase mode or not, and if so, generating a multi-step pulse to perform a multi-step pulse erase operation;

during the multi-step pulse erase operation, checking whether a suspension command has been input or not, if the suspense command was input, suspending the multi-step pulse erase operation and then incrementing the count of a loop counter without resetting a pulse generating number counter, and if the suspense command was not input, resetting the pulse generating number counter and then incrementing the count of the loop counter; as a result of confirming at second times whether the suspense command has been input or not, if the suspense command was input, resetting the count of the loop counter and then confirming whether the suspense command has been input or not at third times;

as a result of confirming at second times whether the suspense command has been input or not, if the suspense command was not input, verifying an erase result, then an erase operation was not successfully performed, proceeding to the step confirming whether it is the multi-step pulse erase mode or not, and if the erase operation was successfully performed, proceeding to the step which resets a loop counter;

as a result of confirming at third times whether the suspense command has been input or not, if the suspense command was input, confirming whether a resume command has been input or not, and if the suspense command was not input, performing a post program process;

as a result of confirming whether a resume command has been input or not, if the resume command was input, using a preserved count to resume the multi-step pulse erase operation, if the resume command was not input, switching a read mode; and as a result of checking whether it is the multi-step pulse erase mode or not, if it is a normal erase mode and not the multi-step erase mode, pumping the voltage level by an erase voltage and then performing a normal erase operation.

11. A multi-step pulse generating circuit comprising:

a loop counter circuit having input thereto a loop reset signal, the loop counter circuit configured to output a first loop signal;

a timer circuit having input thereto said first loop signal and being configured to output a pulse signal;

a pulse generating number counter circuit having input thereto a clock signal, and configured to output an erase reset signal upon reaching a predetermined number of counts; and a multi-step pulse generating block having input thereto said first loop signal, said erase, reset signal and an erase mode signal, said multi-step pulse generating circuit being configured to output said lock signal to said pulse generating number counter circuit, a multi-step pulse erase signal and a normal erase signal, wherein only one of said multi-step pulse erase signal and said normal erase signal are active at any given time; and the loop counter is reset by a loop reset signal when a suspense command is input during a multi-step pulse erase operation, and is not reset when the suspense command is input during a normal erase operation.

12. The multi-step pulse generating circuit according to claim 11, wherein the multi-step pulse erase signal is reset, when the erase reset signal is enabled.

* * * * *